United States Patent [19]

Beltz et al.

[11] Patent Number: 4,531,277
[45] Date of Patent: Jul. 30, 1985

[54] ASSEMBLING COMPONENTS HAVING MATING FACES

[75] Inventors: Richard K. Beltz, Hamburg; Donald M. Large, Temple, both of Pa.

[73] Assignee: AT&T Technologies, Inc., New York, N.Y.

[21] Appl. No.: 599,294

[22] Filed: Apr. 12, 1984

[51] Int. Cl.³ .............................................. B23Q 3/00
[52] U.S. Cl. ....................................... 29/466; 228/6.2; 156/557; 156/572; 156/556; 29/773; 29/759; 29/786
[58] Field of Search ...................... 221/93, 95; 53/285, 53/287, 471, 310, 311, 312; 228/6 A, 47, 49 R; 29/464, 469, 466, 759, 771, 786, 773, 787, 793; 156/564, 565, 556, 573, 572, 557; 414/41, 110; 271/236, 207

[56] References Cited

U.S. PATENT DOCUMENTS

| 2,748,417 | 6/1956 | Heim .................................. 414/41 X |
| 3,272,350 | 9/1966 | Pflaumer et al. ....................... 214/1 |
| 3,965,560 | 6/1976 | Jackson ............................ 29/208 R |
| 3,977,539 | 8/1976 | Hauschild ........................... 414/121 |
| 4,116,431 | 9/1978 | Stange et al. ........................ 271/236 |
| 4,141,457 | 2/1979 | Nocek .............................. 214/1 BV |
| 4,160,352 | 7/1979 | Neff ................................ 53/287 X |
| 4,250,615 | 2/1981 | Knuth et al. .......................... 29/759 |
| 4,261,098 | 4/1981 | Lincoln ................................. 29/809 |
| 4,292,116 | 9/1981 | Takahashi ........................... 156/566 |
| 4,322,068 | 3/1982 | Cayn et al. ........................... 271/207 |
| 4,342,090 | 7/1982 | Caccoma et al. ................. 29/464 X |

FOREIGN PATENT DOCUMENTS 1453688 9/1966 France .................................. 53/287

OTHER PUBLICATIONS

O. H. Olson et al., Article entitled "Orienting Beam Lead Devices", Western Electric Company, Inc., *Technical Digest*, No. 21, Jan. 1971, p. 29.

B. C. Abraham et al., U.S. Patent Application Ser. No. 409,381 (now U.S. Pat. No. 4,449,282 scheduled to issue May 22, 1984).

Primary Examiner—Howard N. Goldberg
Assistant Examiner—John T. Burtch
Attorney, Agent, or Firm—D. C. Watson; G. W. Houseweart

[57] ABSTRACT

Components such as lids (9) and electronic chip carriers (10) are assembled by registering respective mating faces of each component. An array of assembly stations (75) are formed on an upwardly extending edge (67) of a base (66) having a special inclination. For example, a lid (9) is supported with its mating face upturned and a carrier (10) is supported with its mating face downturned upon the upturned face of the lid (9) on the base (66). The inclination causes the components to slide relative to each other and the base in a given direction within each station (75). A plate (92) overlies a plate (72), supported on and inclined with the base (66). Plate (72) has an opening (74) and plate (92) has an overlying opening (94) to each station (75). The openings (74) and (94) have respective reference edges for stopping sliding of, and thereby positioning an upturned lid (9) and a downturned carrier (10) thereupon with a desired registration. A shuttle mechanism (80) reciprocates plate (72) with the openings (74) to and from a magazine (78) to guidably deliver an inverted lid (9) into each station (75). Another magazine (90) is moved to and inclined with the base (66) and guidably delivers an inverted carrier (10) on top of each lid (9) in each station (75). Magazine (90) is moved away and a group clamp (125) is utilized to grasp a resulting array of assembled components for transfer to a subsequent operation.

18 Claims, 11 Drawing Figures

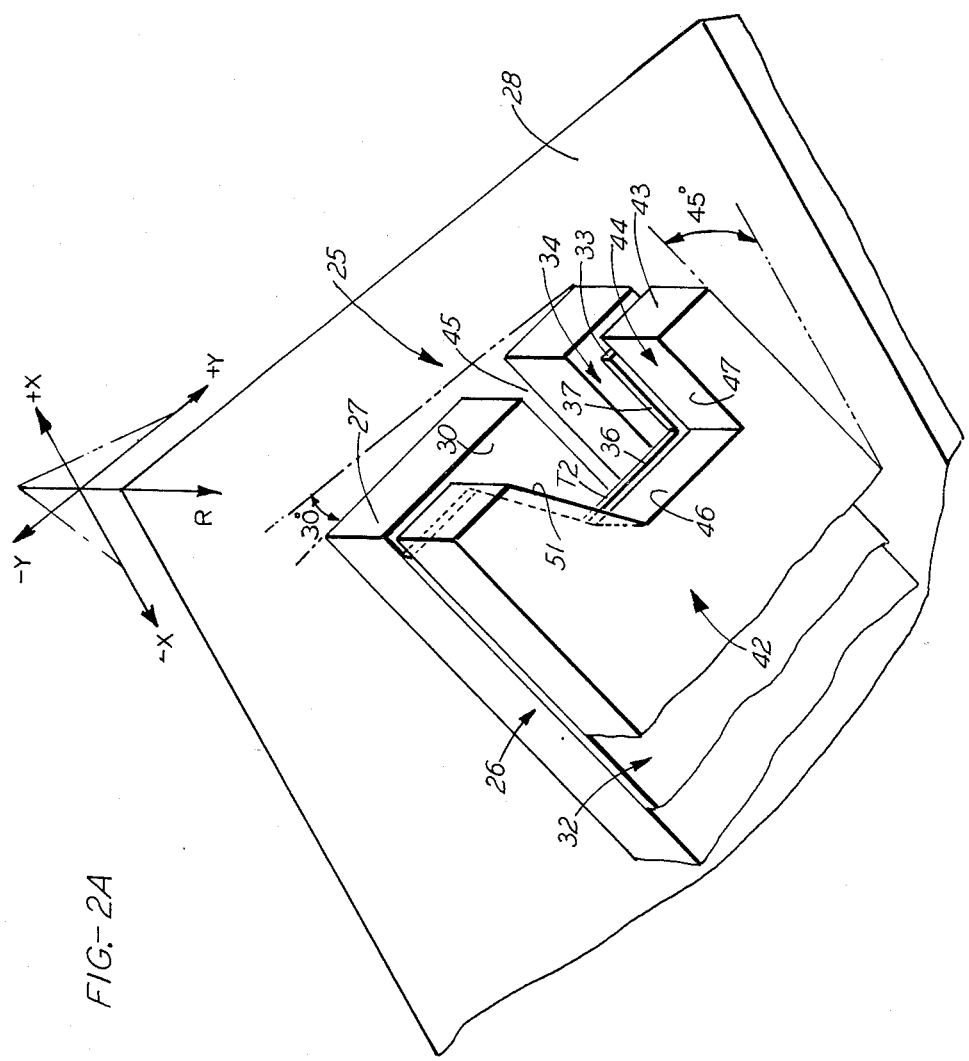

ASSEMBLING COMPONENTS HAVING MATING FACES

TECHNICAL FIELD

This invention relates to assembling components having mating faces. More particularly, this invention relates to assembling a lid having a mating face to the mating face of an enclosure for protecting an electronic element.

BACKGROUND OF THE INVENTION

Adapting elements such as integrated circuit chips (ICs) for service is a major task in the solid state, electronics industry. Such chips may be mounted directly to a substrate and electrically connected to a circuit. More typically today, a chip is mounted in an enclosure having a system of conductors to external leads or pads for connection to sockets or circuit substrates. The enclosure may take many forms including a partial enclosure, a fully enclosed plastic or glass encapsulation or a container which may be hermetically sealed. Such enclosures protect a chip and other elements from deleterious effects of moisture, corrosion and physical abuse.

Containers which are useful for full enclosure typically include a seat to receive a component such as a lid on an accessible topside portion. The seat is made complementary with a major surface of the lid so each component is said to have a mating face. The seat may be lined with bonding material, although more often the seat is metallized and the bonding material is affixed or adhered to the lid. For precision purposes, the seat outline is generally made slightly smaller than the topside surface of an enclosure. Also, the lid is often made smaller than the seat so a fillet of bonding material may be developed about the periphery of an installed lid. Such fillet is adhered to peripheral portions of the seat to effect a good seal.

Modern electronic chips are typically tiny, and contain thousands of devices in a miniature circuit to achieve accelerated performance at low costs. The enclosures are also small to enhance performance between chips and for efficient utilization of space on service substrates. Consequently, the assembly of such enclosures is a problem because of the smallness and/or differences in size of the components. Another problem includes the sometimes tedious procedures associated with registering mating faces of components precisely with each other. It is especially a problem to assemble such enclosures when components are adapted for special bonding, for example, when hermetic sealing is to follow such assembly.

For assembling small components having mating faces on dissimilar sized surfaces, some expedients utilize frames for locating components. A first frame positions a lid with its mating face turned upward and a second, higher frame positions a larger component such as an enclosure with its mating face turned downward upon the upturned lid. Special transfer tools are utilized to handle lids by contacting only external surfaces, opposite the mating faces which often contain delicate features for bonding. Such expedients work well but contain precautionary features which are unnecessary for lids having rugged mating faces. For example, some lids have mating faces bonded with adhered glass frit or thick films of solder which are relatively resistant to abuse and may be handled by simple and economic means.

Accordingly, it is desirable to provide new and improved expedients for assembling components having mating faces, especially components which are small and dissimilar in size. Such assembly should include precise registration of mating faces, particularly when hermetic sealing is involved. Moreover, such expedients should be simple, economical and operable by unskilled personnel or by mechanization.

SUMMARY OF THE INVENTION

Expedients are provided for assembling components including at least one first component such as a lid having an external surface opposite a mating face. Such component is assembled to at least one second component such as a chip enclosure having a mating face, complementary with and joinable to the mating face of the lid. At least one assembly station is formed on an upwardly extending, leading edge portion of a base. Said base is inclined from the leading edge in a given direction sufficiently that both components may slide in a desired manner. For example, a lid is supported with its mating face upturned and its external surface in contact with the base. A chip enclosure is supported with its mating face in contact with the upturned mating face of the lid. The inclination is sufficient that the components readily slide relative to each other and the base within the assembly station by the force of gravity.

In a first embodiment, a first plate is supported on and inclined with the base and has, along a leading edge substantially parallel to the leading edge of the base, a first opening in the assembly station. The first opening contains first reference edges for stopping sliding of, and thereby positioning the lid on the base. A second plate is disposed over and inclined with the first plate and has, along a leading edge substantially parallel to the leading edges of the base and the first plate, a second opening in the assembly station. The second opening contains second reference edges for stopping sliding of, and thereby positioning the chip enclosure on the lid with a desired registration of respective mating faces.

In another embodiment, a shuttle mechanism and a magazine are provided to guidably deliver into the first opening, a lid with its external surface in contact with the inclined base. The lid slides to and is stopped by the first reference edges and becomes positioned within the assembly station. Another magazine is provided to guidably deliver into the second opening, a chip enclosure with its mating face in contact with the mating face of the lid. The chip enclosure slides to and is stopped by the second reference edges and becomes positioned upon the lid to complete the assembly at the station.

BRIEF DESCRIPTION OF THE DRAWING

The invention will be more readily understood from the following detailed description when read in conjunction with the accompanying drawing, wherein:

FIGS. 2A, 2B and 2C are successive pictorial views of a station showing successive steps for assembling a first component such as a lid to a larger, second component such as a chip enclosure;

Figure 1:
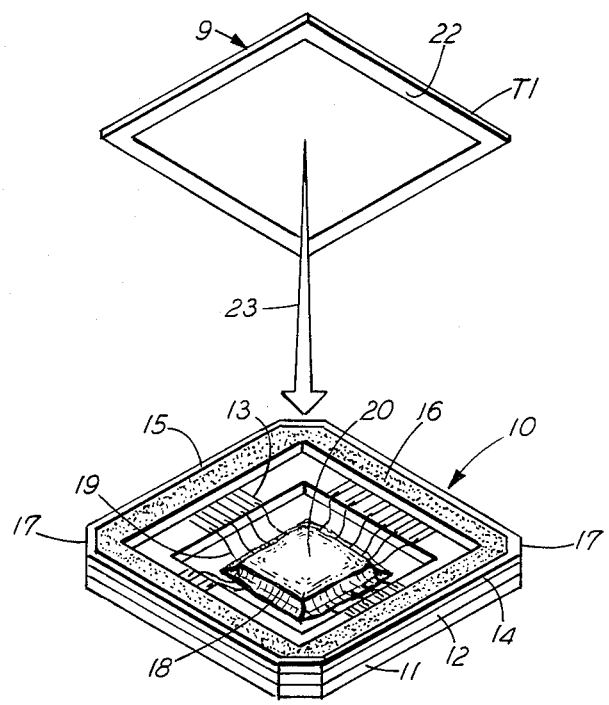
FIG. 1 is an exploded view of a common type of chip enclosure which is advantageously assembled in the practice of the present invention.

It can be seen that some elements in the figures are abbreviated or simplified to highlight certain features of the invention. Also, where appropriate, reference numberals have been repeated in the figures to designate the same or corresponding features in the drawing.

DETAILED DESCRIPTION

The Components

FIG. 1 shows a first component 9 and a second component 10 which are assembled in the practice of the invention. For purposes of illustration and discussion, the second component will also be referred to herein as an electronic element enclosure 10 or as a chip carrier 10. However, the invention should not be understood as referring only to such enclosures or only to electronics work. It is believed that the invention is reasonably applicable to a broad range of components having mating faces which require registration for assembly.

The first component 9 will also be referred to for illustration and discussion as a seat covering 9 or merely as a lid 9. Holders for electronic elements take on many forms in industry and they may or may not be fully enclosed. Also, such holders are not always fully enclosed by utilizing another component such as a lid 9. For example, the enclosure 10 may accommodate an electronic element for service connection and have a molding type material encapsulating the elements without the necessity for a lid 9. Of course, when a tight seal is required on an enclosure 10 such as for hermetic sealing, a lid may be utilized. Consequently, the second component is often referred to alone as an enclosure 10 or a carrier 10, whether or not a lid 9 is attached thereto.

The second component 10, illustrated in FIG. 1, seems to be accorded a special status in the art. For example, it is often referred to as a chip carrier 10 which typically accommodates a single chip rather than several chips or a chip and other active or passive elements. However, it will be utilized for illustration and discussion because of its relative simplicity and not because it is the only enclosure of electronic elements amenable to the practice of the invention.

Carrier 10 is often constructed of three layers of ceramic material enclosing a system of metalized conductors. For example, a bottom layer 11 may have an array of metal pads (as seen in FIG. 2C) for connection to contacts on a service substrate. A next higher layer 12 may be a frame supporting an array of internal metal contacts 13 which are directly connected to the bottom pads. A top layer 14 may be a frame having a topside 15 supporting a carefully constructed metalized seat 16.

The carrier 10 shown has chamfered corner portions 17, to avoid snagging to irregular features in magazines for handling the individual layers 11, 12 and 14 or the constructed carriers 10. It will also be seen that the seat 16 is formed within the edges of topside 15. Accordingly, seat 16 may be more precisely outlined and have a more controlled topography than the ceramic topside 15.

Within carrier 10, an electronic chip 18 has been mounted, typically by bonding to a metal contact (not shown) formed in the bottom layer 11. From the chip 18, a plurality of wires 19 extend and are typically bonded to the internal contacts 13. After the wires 19 are bonded, a layer 20 of room temperature vulcanized (RTV) silicone rubber is often applied to the chip 18 to protect it from moisture and other hazards.

The lid 9, shown in FIG. 1, is typically made of a gold plated metal or a ceramic material such as alumina. An often preferred metal lid has a separate frame 22 of solder affixed to the lid typically by spot attachment at the corners. The ceramic lids may have a frame of glass frit or solder adhered by masking and deposition methods. Some of the solder frames may be fragile and require special handling. However, most bonding features are becoming more ruggedly applied and may be handled by economical means. All such lids, whether of metal or other material, are designated herein by the numeral 9 and all bonding materials of any kind having a frame outline are designated by the numeral 22.

When lid 9 is bonded to seat 16 of topside 15 the bonding material is typically squeezed out along the edges of lid 9 and forms a fillet thereabout. Such a fillet is advantageous to good bonding and is particularly helpful when there is a peripheral seat portion extending slightly beyond lid 9 and under the fillet. Also, it is advantageous to avoid having bonding material flow over the topside 15 of the enclosure 10.

Consequently, it is known in the art to have the seat 16 smaller than the topside 15 and to have the lid 9 smaller than the seat 16. All such relative sizes are measured transversely of the items when the lid 9 is bonded in place. Typically, the lid 9, the carrier 10, the topside 15 and the seat 16 are all very small in size and weight.

For example, the carrier 10 may be about 0.400 inch square by about 0.060–0.080 inch high and weigh about 0.40 gram. The seat may be about 0.360 to 0.380 inch square and the lid 9 may be about 0.350 to 0.360 inch square by about 0.020 inch thick (shown as thickness T1) and weigh about 0.20 gram.

From the above, it is apparent that the components are small and the lid 9 is quite different in size and weight from the carrier 10. Therefore, it is a difficult task to manipulate the components and to center the lid 9 precisely upon the seat 16.

The mating face for lid 9 is readily recognized and for purposes of description will be defined by the edges of lid 9 because registration is best made by reference to such edges to achieve good bonding. However, registration of lid 9 to carrier 10 is made by reference to seat 16 rather than to topside 15. For good bonding such registration is best made by centering the lid 9 on seat 16 thus permitting a peripheral portion of seat 16 to be exposed prior to bonding. However, most of seat 16 is thus covered by lid 9 so the mating face for component 10 will be described herein as substantially defined by the seat 16.

Assembling Components

As seen in FIG. 1, carrier 10 is normally oriented in an upright manner because topside 15 is accessible to install elements, do wire bonding and apply protective coatings such as the RTV material 20. Consequently, it is conventional to install lid 9 according to arrow 23 as a natural next stop after installing chip 18 and also because centering lid 9 upon seat 16 is readily observed when carrier 10 is upright. However, it is sometimes found advantageous to invert the assembly by registering a downturned mating face of an enclosure 10 to an upturned mating face of a lid 9. Such inverted assembly is fully set forth in a copending U.S. patent application, Ser. No. 409,381, filed Aug. 18, 1982, now allowed, and assigned to the Western Electric Company, Inc. Such application teaches problems in handling chip carriers and expedients for assembling carriers, especially carriers having lids with delicate bonding features. Consequently, such application and the patent which issues therefrom is hereby incorporated herein by this reference.

Figure 2B:
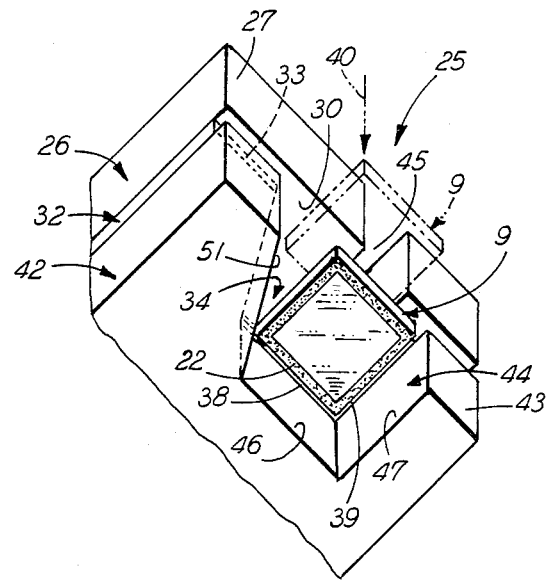
Figure 2C:
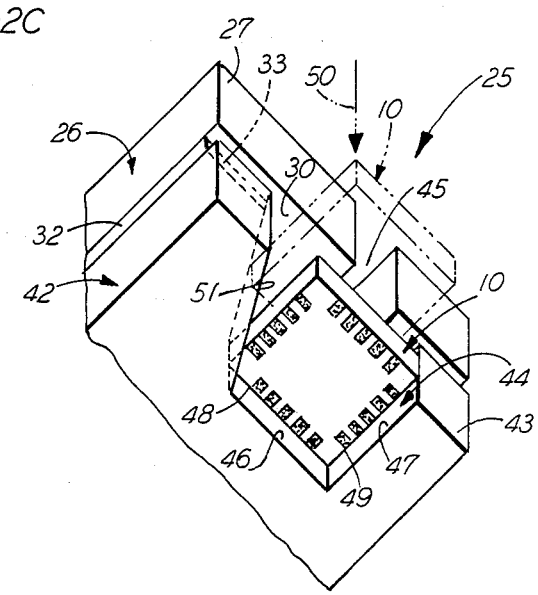

The instant invention also utilizes an inverted method of assembling components in an assembly station typical of that seen in FIGS. 2A, 2B and 2C (designated generally by the numeral 25). Station 25 is formed on a base 26 which has an upwardly extending, leading edge 27. Base 26 is inclined from edge 27 toward a $-X$ and a $+Y$ direction in angular amounts taken with respect to a horizontal plane parallel to that exemplified by a horizontal table top 28. Such angular inclinations could be considered components of a singular resultant inclination in a given direction according to a vector R. Because such inclination is often expressed as a gradient, the directions and movements along an inclined member will often be expressed herein as upgrade or downgrade for clarity.

The inclination of base 26 is important to the invention and is believed to present an advantage over the prior art to be explained herein. The inclination is selected according to weight and surface characteristics and should be sufficient in direction and amount to cause both components to slide in a desired manner under the force of gravity.

For example, base 26 may be inclined about 45° toward the $-X$ direction and about 30° toward the $+Y$ direction which results in an inclination of about 51° from a horizontal plane, toward the R direction. It will be seen that such inclination of base 26 is sufficient to assemble the illustrative components in the practice of the invention.

Station 25 is formed on base 26 utilizing a metal surface 30 which is made desirably smooth and resistant to abrasion by known means. A plate 32 is supported on and inclined with base 26 and has a leading edge 33 which is substantially parallel to the leading edge 27 of base 26. An opening 34 is provided along the leading edge 33 of plate 32 to receive and locate a component 9 at assembly station 25.

Opening 34 has reference means for stopping sliding of, and thereby positioning a first component 9 as seen in FIG. 2B. Such means may be comprised of pins, protrusions or various type edges of plate 32 depending upon the shape and desired orientation of a first component 9.

A lid 9 advantageously has at least two, substantially straight edges useful for reference purposes. Accordingly, opening 34 is provided with edges 36 and 37 (FIG. 2A) which are located downgrade of the inclined portion of base 26 located within opening 34. Edges 36 and 37 correspond with and are disposed substantially parallel to selected reference edges of a lid 9.

FIG. 2B shows that edges 38 and 39 of lid 9 have been selected as reference edges. Also, lid 9 has been guidably delivered into opening 34 in station 25 by means to be explained later. By guidably delivered, it is meant that a lid 9 has been delivered into opening 34 with an approximately desired orientation but not necessarily into a precise position. The lid 9 could be in the position shown in phantom lines from which lid 9 then slides in a direction according to arrow 40 into the precise position shown in solid lines. Edges 36 and 37 of plate 32 have stopped sliding of lid 9 and respectively engaged edges 38 and 39 of such lid.

It is incidentally noted that a third (unseen) edge of opening 34 in plate 32 takes no particular part in positioning lid 9. Such edge is so configured that it is avoided by lid 9 during the delivery and sliding steps. It is also seen that the mating face of lid 9 is turned upward and a bonding frame 22 is exposed for registration to a second component.

The plate 32 has a thickness T2 which is best indicated along an edge such as reference edge 36 in FIG. 2A. It will be appreciated in later discussion that thickness T2 is advantageously less than the thickness T1 of a lid 9. By making plate 32 sufficiently thin, the height of lid 9 protrudes above plate 32 (FIG. 2B) to fully support an enclosure 10 without contact to plate 32 to assure accurate registration of the components.

Another plate 42 is disposed over and inclined with the plate 32. Plate 42 has a leading edge 43 which is substantially parallel to the leading edges 27 and 33 of base 26 and plate 32, respectively. Opening 44 is provided along the leading edge 43 of plate 42 to receive and locate another component at assembly station 25.

Opening 44 has reference means for stopping sliding of, and thereby positioning a second component 10 as seen in FIG. 2C. Such means are selected according to similar considerations applied to the reference means for opening 34. An enclosure 10 advantageously has at least two, substantially straight edges useful for reference purposes. Accordingly, (FIG. 2A) opening 44 is provided with edges 46 and 47 which are located above plate 32 and are offset downgrade from the reference edges 36 and 37, respectively, of the opening 34.

The downgrade offset of edge 46 from edge 36 and edge 47 from edge 37 depends upon the characteristics of the components and their mating faces. The offset provided in FIGS. 2A, 2B and 2C is sufficient to accommodate an enclosure 10 in an inverted condition upon and in registration with the inverted lid 9 in the opening 34.

FIG. 2C shows that edges 48 and 49 of an enclosure 10 have been selected as reference edges. Also, enclosure 10 has been guidably delivered into opening 44 in station 25 by means to be explained later. By guidably delivered, it is meant that an enclosure 10 has been delivered similarly to lid 9, i.e., the enclosure 10 has been delivered into opening 44 with an approximately desired orientation, but not necessarily into a precise position.

Of course the enclosure 10 is delivered with opposite facial disposition from the lid 9. Enclosure 10 is delivered with its mating face in contact with the upturned mating face of the lid 9. The enclosure 10 may be delivered in the position shown in phantom lines in FIG. 2C.

Note that reference edges 46 and 47 of opening 44 correspond with and are substantially parallel to the reference edges 48 and 49 of enclosure 10. The enclosure 10 then slides in a direction according to arrow 50 into the precise position shown in solid lines. Edges 46 and 47 of plate 42 have stopped sliding of enclosure 10 and respectively engaged edges 48 and 49 of such enclosure.

It is seen that a third edge 51 of opening 44 in plate 42 serves no particular function in positioning enclosure 10. Edge 52 is merely configured so it is avoided by enclosure 10 during the assembly. It is also seen that the external surface of enclosure 10 is turned upward and contact pads are exposed to view. It will be appreciated that motion arrows 40 and 50 have the same direction as vector R (FIG. 2A) resulting from the inclination of base 26 in the $-X$ and $+Y$ directions.

The above discussion shows that the inclination of base 26 and of plate 32 supported thereon is obtained by examining the gravitational force required to slide the components in their delivered disposition. The lid 9 is delivered and supported with its mating face upturned and its external surface in contact with base 26. The enclosure 10 is delivered and disposed with its mating face in contact with the mating face of the lid 9. As so delivered, the inclination is such that both components will readily slide relative to each other and the base within assembly station 25.

Guidably Delivering Components

Figure 3:
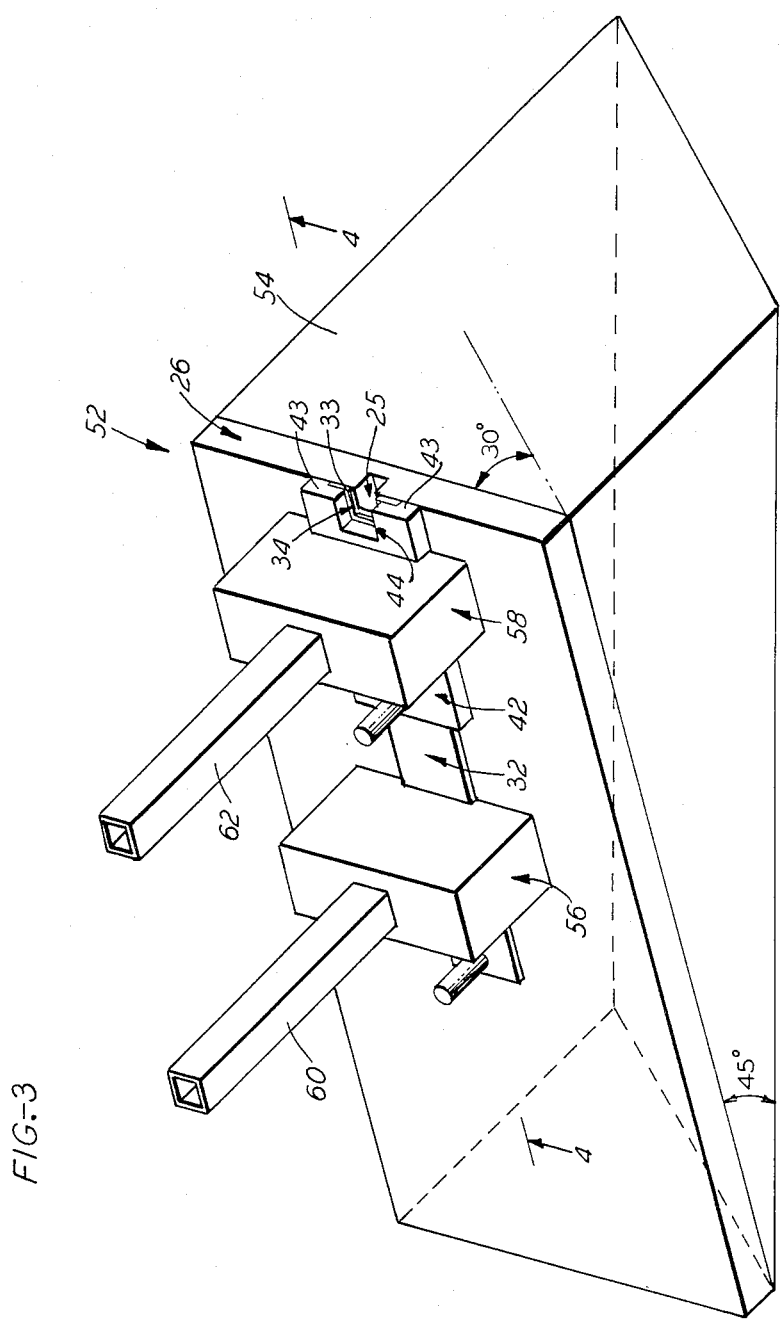
FIG. 3 is a pictorial view of simple apparatus for guidably delivering components into an assembly station such as that shown in FIGS. 2A, 2B and 2C.

Probably the simplest, although not the most expeditious way to guidably deliver the components is by manually manipulating a conventional tweezer tool. FIG. 3 illustrates simple and more expeditious apparatus 52 for guidably delivering components into an assembly station 25. A stand 54 supports the base 26 in the inclined attitude described previously. There is slidably supported upon and inclined with base 26, the plate 32 having the opening 34 in the leading edge 33. There is also disposed over and inclined with plate 32, the plate 42 having the opening 44 in the leading edge 43.

Figure 4:
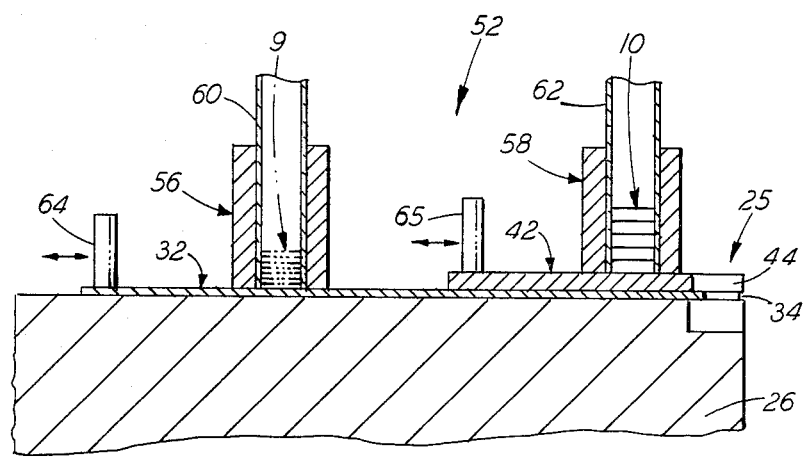
FIG. 4 is a sectional view of the apparatus shown in FIG. 3, taken along line 4—4.

For guidably delivering a lid 9 and an enclosure 10 to assembly station 25, respective magazines 56 and 58 are disposed upon the base 26. The magazines 56 and 58 have respective tubes 60 and 62 disposed downgrade from the leading edge of, and substantially perpendicular to the plates 32 and 42, respectively. The association and operation of tubes, plates, openings and the assembly station 25 is best seen in FIG. 4 which is a sectional view taken along line 4—4 in FIG. 3.

The tubes 60 and 62 hold single columns of lids 9 and enclosures 10, respectively, oriented parallel to plate 32 and 42. The lids 9 have their external surfaces facing downward and the enclosures 10 have their mating faces turned downward toward plates 32 and 42, respectively. The respective weights of columns of lids 9 and enclosures 10 press each leading component against the plates 32 and 42, respectively.

An upstanding handle 64 and guiding means (not shown) are provided to manually reciprocate plate 32 relative to the base 26 to move opening 34 along a path between station 25 and tube 60. Similarly, handle 65 and guiding means (not shown) are provided to reciprocate plate 42 relative to plate 32 along a path between station 25 and tube 62.

The opening 34 passes under tube 60 such that a leading lid 9 falls into and is captured by opening 34 and is moved by plate 32 to assembly station 25. Similarly, the opening 44 passes under tube 62 such that a leading enclosure 10 falls into and is captured by the opening 44 and is moved by plate 42 over the lid 9 at the assembly station 25. It will be appreciated that there are successive movements of plates 32 and 42. Such movements, combined with the inclination of the base 26 and plates 32 and 42, do a fine job of positioning the components against the reference means in station 25.

Assembling Arrays of Components

The apparatus 52, shown in FIGS. 3 and 4 is simple and economical and could be enlarged to assemble arrays of components. Nevertheless, it is presently preferred to utilize apparatus 65 shown in FIGS. 5, 6 and 7 to guidably deliver to, and assemble at an array of stations, the components 9 and 10.

Figure 5:
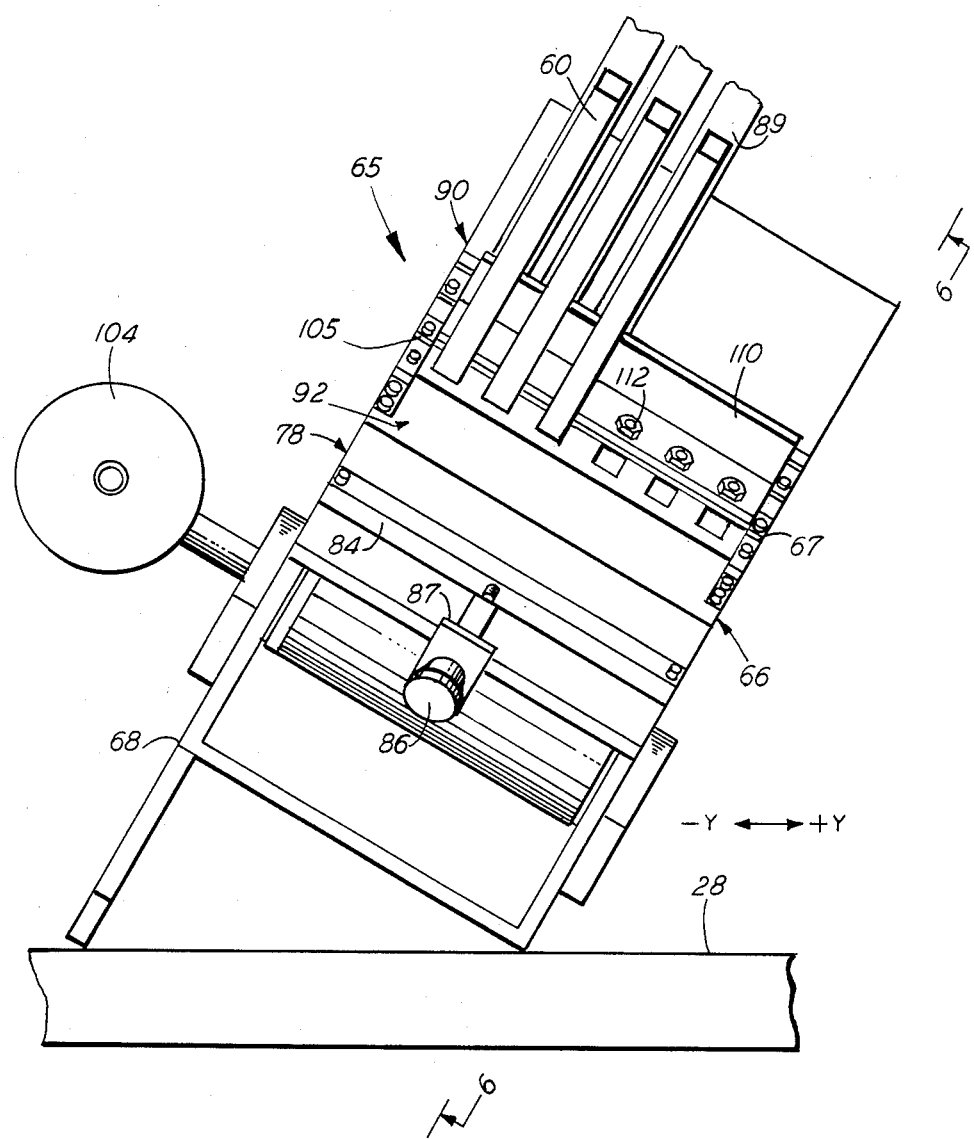
FIG. 5 is an end view of presently preferred apparatus for guidably delivering a plurality of components into a plurality of assembly stations such as that shown in FIGS. 2A, 2B and 2C.
Figure 6:
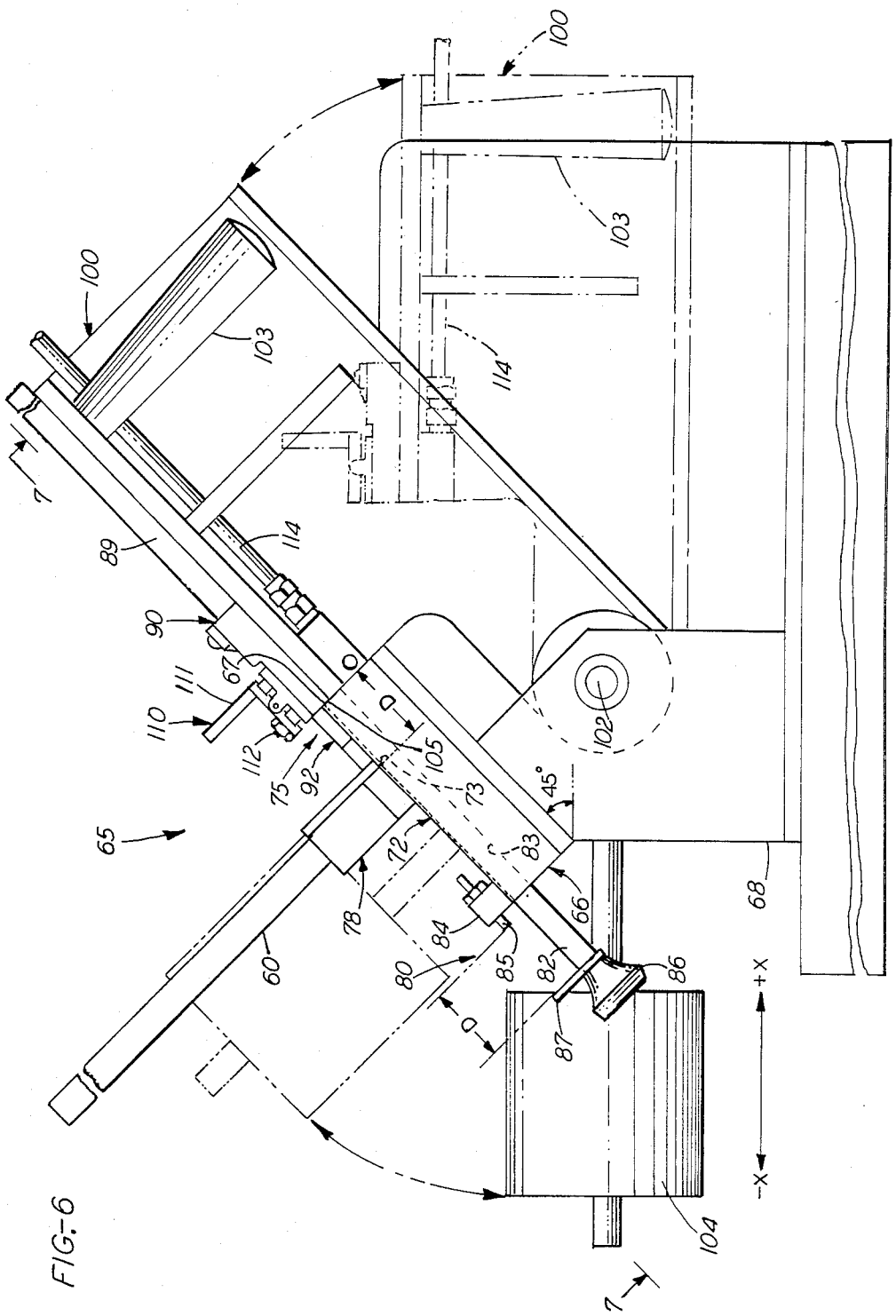
FIG. 6 is an auxiliary view of the apparatus shown in FIG. 5, taken along line 6—6.
Figure 7:
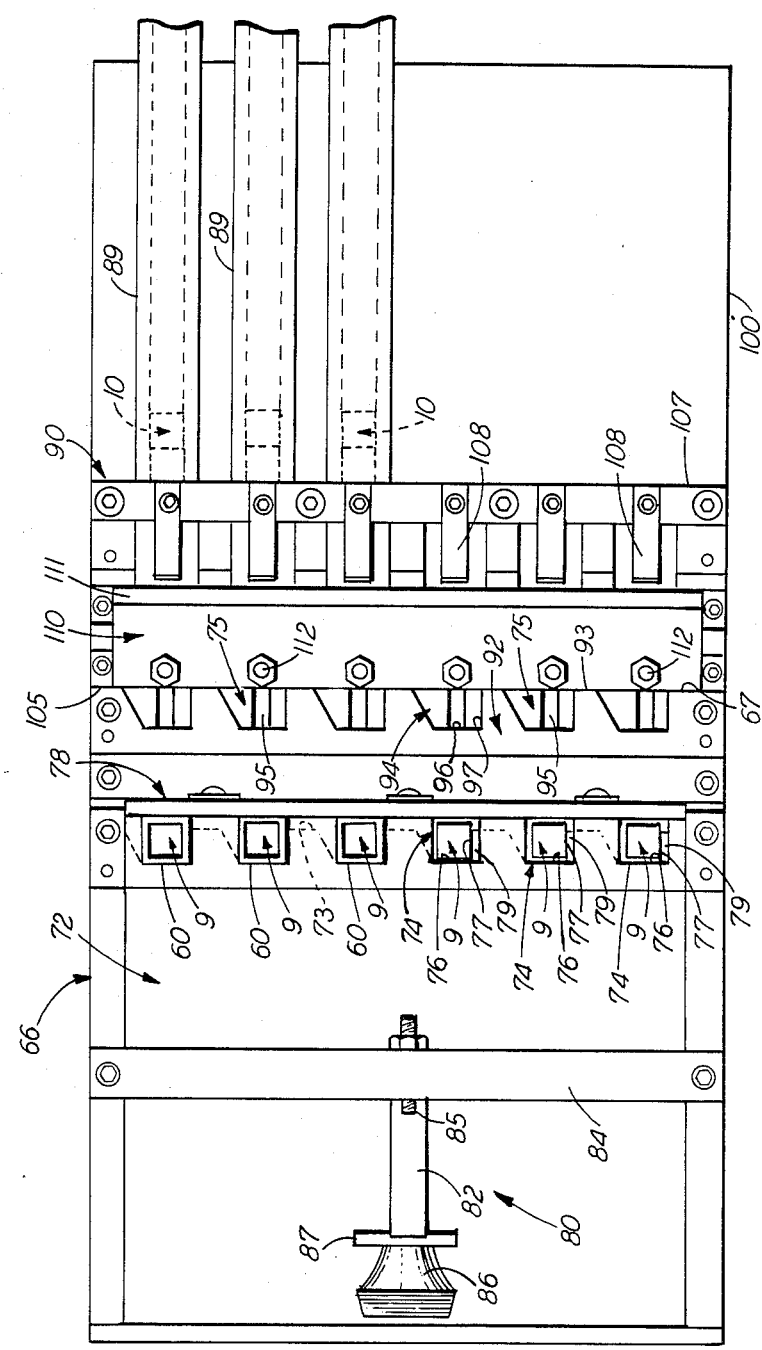
FIG. 7 is an auxiliary view of the apparatus shown in FIG. 6, taken along line 7—7.

FIG. 5 is an end view of apparatus 65 showing a base 66 supported in an inclined manner toward a $+Y$ direction by a stand 68 on bench top 28. Base 66 is also inclined in a $-X$ direction as shown in FIG. 6 which is an auxiliary side view taken along line 6—6 of FIG. 5. Apparatus 65 is also shown in FIG. 7 which is an auxiliary top view taken along line 7—7 of FIG. 6.

The base 66 has an upwardly extending, leading edge 67 to which there is abutted a movable magazine designated generally by the numeral 90 to be described later. Along the leading edge 67 of base 66, there are located a plurality of assembly stations 75 (FIG. 7) in an array suitable for access by magazine 90 and by tools for transferring assembled components.

There is supported on, and inclined with base 66, a plate 72 (FIGS. 6 and 7) having a leading edge 73 substantially parallel to the leading edge 67 of base 66. Plate 72 is shown in a fully retracted position in FIGS. 5, 6 and 7, for capturing lids 9. An array of openings 74 is provided along the leading edge 73 although only three such openings are exposed and designated for description in FIG. 7. Openings 74 have reference edges 76 and 77 for stopping sliding of and thereby positioning lids 9 on base 66 when plate 72 is advanced to the stations 75.

Base 66 also supports a magazine 78 having a plurality of tubes which may be identical to the tubes 60, shown in FIG. 4. At three positions in magazine 78, tubes 60 are in place and a column of lids 9, exemplified by a top, inverted lid can be seen in each tube. At the other three positions in magazine 78, tubes 60 are removed to reveal, at each of three openings 74 in plate 72, a portion 79 which is hidden when a tube 60 is in position. It can be seen that respective inverted lids 9 have fallen adjacent respective portions 79 and are captured by the openings 74. The capturing function occurs substantially simultaneously in all openings 74 in the array and the plate 72 may then be advanced to the stations 75.

A shuttle mechanism 80 includes a preferably rectangular plunger 82, attached to and provided for reciprocating plate 72 in the manner described. Plunger 82 rides in a slot 83 (FIG. 6) which preferably extends to the leading edge 67 of base 66 to maintain alignment of plunger 82. A bar 84 extends transversely of base 66 and includes a stop 85 to control travel of a knob 86 and a stop plate 87 attached to plunger 82. In operation of plunger 82 and plate 72, the knob 86 is grasped and moved a distance D corresponding to the distance required to reciprocate the openings 74 along respective paths between stations 75 and the tubes 60 in magazine 78.

FIG. 2C shows how the lids 9 appear after they are guidably delivered to respective assembly stations so such delivery step is omitted in FIGS. 5, 6 and 7 for clarity. The next step is to guidably deliver inverted enclosures 10 upon the inverted lids 9.

In operation of the apparatus 52 shown in FIG. 4, the enclosures 10 are delivered from a tube 62. The tube 62 holds the enclosures 10 parallel to each other and with each mating face turned downward upon and in contact with an external surface of another enclosure. However, it is presently preferred to handle such enclosures 10 by sliding the same on mating faces in channels 89 shown on magazine 90 in FIGS. 5, 6 and 7.

Magazine 90 is adapted to deliver the enclosures 10 into the stations 75 at the leading edge 67 of base 66. Therefore, a plate 92 is provided in a fixed manner on base 66 to control an array of enclosures 10 at the stations 75. Plate 92 has, along a leading edge 93 (FIG. 7), an array of openings 94, each containing reference edges 96 and 97 for stopping sliding of, and thereby positioning the enclosures 10.

When the openings 74 (with lids 9) have been advanced to stations 75 by plate 72, the openings 94 and 74 overlap such that reference edges 76 and 77 relate, respectively, to edges 96 and 97 (see the offset in FIG. 2A). Such relation provides a desired registration of mating faces after magazine 90 has guidably delivered an array of enclosures 10 according to expedients which will now be described.

Magazine 90 (FIG. 6) includes a structure 100 which is pivotably movable about a pin 102 installed in the stand 68. A handle 103 may be grasped to move magazine 90 counterclockwise (CCW) to an active position (solid lines) or clockwise (CW) to a resting position (phantom lines). A counterweight 104 assists in holding a downward leading edge 105 of magazine 90 securely against the upwardly extending, leading edge 67 of the base 66. In the active position, magazine 90 is inclined in the same manner as the base 66, i.e., at 45° toward the −X direction (FIG. 6) and at 30° toward the +Y direction (FIG. 5). However, because FIG. 6 is an auxiliary view, the magazine 90 appears to be fully horizontal when it is in the resting position. The channels 89 are then horizontally extending so there is a lack of pressure between and along a file of enclosures 10. However, the structure 102 is still inclined in the +Y direction as shown in FIG. 5.

In the active position of magazine 90, each channel 89 is inclined downgrade toward and in communication with an assembly station 75 on the base 66. The channels 89 (FIG. 7) are secured on structure 100 by a cross bar 107 and a plurality of spring clips 108. Each channel 89 holds, by supporting on respective mating faces, a single file of enclosures 10. Magazine 90 is adapted for slidably delivering successive ones of enclosures 10 into each station 75. A mating face of a respective enclosure 10 is slidably contacted to and registers with the mating face of a respective lid 9.

To facilitate the above function, magazine 90 has an escapement mechanism 110 for controlling downgrade, sliding advancement of, and for successively releasing from each file, a leading enclosure 10. Escapement 110 includes an angular member 111 which is pivotally mounted and biased in a CCW direction (FIG. 6). Member 111 applies or releases pressure to an array of spring plungers 112, each located along a path traversed by an enclosure 10 from a channel 89 to an assembly station 75. Each plunger 112 applies pressure to the external surface of a leading enclosure 10 and releasably holds the same against structure 100 to stop a trailing file from a channel 89.

In operation of apparatus 65, one reciprocates plunger 82 (affixed to plate 72) to capture, guidably deliver and position an array of lids 9 in the array of stations 75. The magazine 90 is then pivotally moved CCW to abut edge 105 to the leading edge 67 of base 66. The escapement 110 is actuated by pivoting angular member 111 in a CW direction to release the plungers 112 from an array of leading enclosures 10. An enclosure 10 slides into a respective station 75 and is stopped by the reference edges 96 and 97 (FIG. 7) of the opening 94. A trailing file of enclosures 10 in the respective channel 89 is also stopped by stopping the leading enclosure. The angular member 111 is releasably pivoted in a CCW direction and each plunger 112 presses down upon a trailing enclosure 10 to stop potential sliding of a file in a respective channel 89.

The magazine 90 is then pivoted in a CW direction about pin 102 (FIG. 6) to separate edge 105 from the leading edge 67 of the base 66. Magazine 90 is thereby brought into the resting position shown in phantom lines in FIG. 6 whereby channels 89 may be readily replaced. Also, the array of assembly stations 75 is accessible substantially simultaneously. The resulting assemblies of enclosures 10 to lids 9 may be removed in an array by associated clamping and transfer means.

Clamping Assemblies

An assembly of first and second components such as a lid 9 and an enclosure 10 may be readily removed from an assembly station 25 by utilizing conventional tweezers. A slot 45 is extended (FIGS. 2A, 2B and 2C) into the portion of base 26 exposed by openings 34 and 44 to admit a lower jaw of such tweezers below an assembly in station 25. Such an assembly of components may also be removed by utilizing a preferred, singular clamp 115 shown in FIG. 8A (an end view).

Figure 8A:
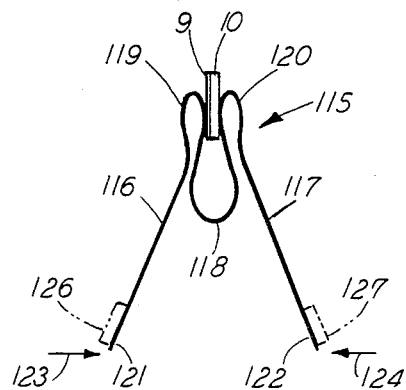
FIG. 8A is a side view of at least one clamp for grasping and transferring an assembly of components from a station.

Clamp 115 is advantageously made from a strip of metal about 0.2 inch wide. The strip is bent into the configuration shown in the end view and the metal is hardened. Clamp 115 has a pair of resilient members 116 and 117 attached to and separated by a biasing portion 118. Portion 118 is located between ends 119 and 120 and free ends 121 and 122 of members 116 and 117, respectively. Ends 121 and 122 are utilized to open clamp 115 in response to pressure applied according to arrows 123 and 124. The biasing portion 118 holds the clamping ends 119 and 120 in a symmetrical, normally closed condition sufficient to securely grasp the assembly of components 9 and 10 as shown in FIG. 8A.

Figure 8B:
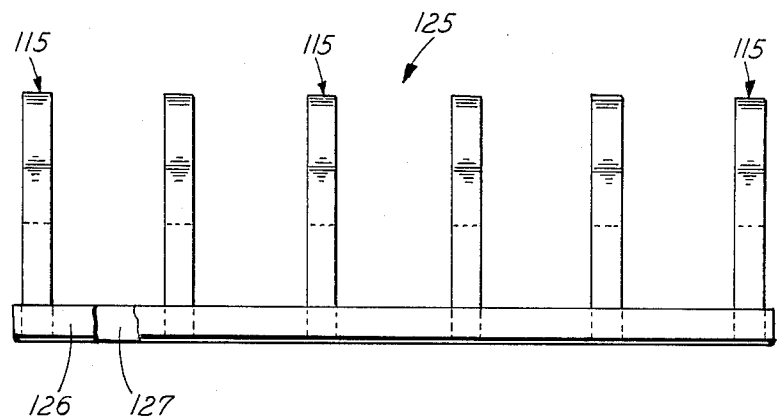
FIG. 8B is an elevation view of a plurality of such clamps in an array suitable for simultaneously grasping and removing an array of assemblies from the apparatus shown in FIGS. 5, 6 and 7.

An array of assemblies is also readily clamped and removed from the array of stations 75 shown in FIGS. 5, 6 and 7 using a group clamp 125 shown in FIG. 8B. Clamp 125 comprises a plurality of singular clamps 115 (FIG. 8A) which are merely assembled into a group by affixing bars 126 and 127 (shown in phantom lines in FIG. 8A and solid lines in FIG. 8B). Group clamp 125 has its singular clamps 115 disposed in an array corresponding to the array of assembly stations 75 shown in FIGS. 5, 6 and 7.

A plurality of slots 95 are provided in base 66, each extending from the leading edge 67, at least into the openings 74 and 94 in plates 72 and 92 at each respective station 75. Each slot 95 is adapted to admit a lower jaw (such as a clamping end 120) below an assembly of components 9 and 10 at each station 75.

The clamps 115 or 125 are movable such that the ends 119 and 120 are insertable in an open condition into respective assembly stations 25 or 75. For example, an end 120 may be inserted into a slot 45 or 95 below an assembly and an end 119 may be inserted into an opening 44 or 94 above an assembly. The clamping ends 119 and 120 are then closed by releasing pressure from free ends 121 and 122. The clamping ends 119 and 120 and assemblies therebetween may then be moved from the stations for transfer to a subsequent operation.

Other Considerations

It will be appreciated that the embodiments shown and described are simple and inexpensive when compared with prior art apparatus for assembling components such as enclosures 10 to lids 9. Also, it is found that the rate of assembly utilizing, for example, the apparatus 65, is much more rapid than prior art apparatus.

Further refinements to the apparatus 65 are often of value. For example, an air system utilizing a supply line 114 (FIG. 6) is sometimes of value to provide a low pressure air cushion under each enclosure 10 at escapement 110. The pressure from the plungers 112 may cause some enclosures to adhere to structure 110 and the air is of value in breaking such adherence.

In a further refinement, a vibrator (not shown) could be applied to base 66 or to magazine 90 or both to accelerate movement of the components and to ensure proper positioning in the assembly stations.

It is of further interest to note that the tubes 60 and 62 (FIG. 4) and the channels 89 are readily removed for filling. The associated magazines advantageously accept commercially available tubes and channels used in prior operations on the lids 9 and enclosures 10.

There have been illustrated herein certain practical embodiments and applications of the invention. Nevertheless, it is to be understood that various modifications and refinements may be made and used which differ from the disclosed embodiments without departing from the spirit and scope of the present invention.

What is claimed is:

1. A method of assembling at least one first component having an external surface opposite a mating face to at least one second component having a mating face complementary with and joinable to the mating face of the first component, comprising:

establishing at least one assembly station on an upwardly extending, leading edge portion of a base, said base being inclined therefrom in a given direction sufficiently that a first component, supported with its mating face upturned and its external surface in contact with the base, and a second component, supported with its mating face in contact with the upturned mating face of the first component, readily slide relative to each other and the base within said assembly station by the force of gravity;

supporting on and inclining with the base, a first plate having along a leading edge substantially parallel to the leading edge of the base, at least one first opening containing first reference means for stopping sliding of, and thereby positioning the first component on the base in said assembly station;

disposing over and inclining with the first plate, a second plate having along a leading edge substantially parallel to the leading edges of the base and the first plate at least one second opening containing second reference means for stopping sliding of, and thereby positioning the second component on the first component with a desired registration of respective mating faces in said assembly station;

guidably delivering into at least the first opening in the first plate, a first component with its external surface in contact with the inclined base such that said first component slides to and is stopped by the first reference means and becomes thereby positioned within said assembly station; and guidably delivering into at least the second opening in the second plate, a second component with its mating face in contact with the mating face of the first component such that said second component slides to and is stopped by the second reference means and becomes thereby positioned upon the first component to form an assembly ready for bonding.

2. A method as in claim 1, wherein the steps of establishing the assembly station further comprises:

disposing a plurality of such stations along the upwardly extending, leading edges of the base and first and second plates in an array suitable for access to all stations substantially simultaneously for the assembly of components.

3. A method as in claim 2 wherein the step of guidably delivering a first component, further comprises:

disposing in a first magazine, a plurality of first tubes in an array downgrade from the leading edge of, and substantially perpendicular to the first plate;

holding in each such first tube, a single column of first components having external surfaces facing downward such that the weight of the column presses the external surface of a leading first component against the first plate;

disposing along the leading edge of the first plate, a plurality of first openings in an array corresponding to the first tubes and the assembly stations; and reciprocating the first plate relative to the base to thereby move each respective first opening along a path between a respective station and an associated first tube, each first opening passing under a first tube such that a leading first component falls into and is captured by said first opening and is moved by the first plate to said respective assembly station.

4. A method as in claim 3, wherein said second plate has along its leading edge, a plurality of second openings in an array corresponding to the assembly stations and wherein the step of guidably delivering a second component further comprises:

disposing in a third magazine, a plurality of channels, each inclined downgrade toward and in communication with a second opening at one of the assembly stations;

holding in each channel, by supporting end-to-end on respective mating faces, a single file of second components for slidably delivering successive ones into a second opening such that a mating face of a respective second component slidably contacts and registers with the mating face of a respective first component; and pivoting an escapement mechanism associated with the third magazine for controlling downgrade, sliding advancement of, and for successively releasing from each file a leading second component after a first component is guidably delivered into and positioned in a respective first opening.

5. A method as in claim 4, further comprising:

moving the third magazine to and from the assembly stations, thereby permitting the assembly stations to be accessible and the assemblies to be removed substantially simultaneously in an array by an associated clamping and transfer tool.

6. A method as in claim 5, wherein the second component has a peripheral seat located within the edges of a top side, said seat substantially defining the second mating face, and the first component serves as a covering for the seat, said first component having the first mating face defined by edges of the first component and being smaller than the top side of the second component, at least when measured in a transverse direction common to the first component and the top side of the second component, both first and second components having at least two, substantially straight edges useful for reference purposes and wherein the steps of disposing openings further comprise:

disposing the first opening with first reference edges located downgrade on the inclined base portion within said opening, such edges corresponding with and being disposed substantially parallel to the reference edges of the first component as such component is guidably delivered into and slides on the inclined base within the opening to be stopped by said first reference edges; and disposing the second opening with second reference edges lying above the first plate and offset downgrade from the first reference edges of the first opening sufficient to accommodate a second component in an inverted condition upon and in registration with a first component in the first opening, such second reference edges corresponding with and being disposed substantially parallel to the reference edges of the second component as such component is guidably delivered into and slides upon the first component inclined with the base portion within the second opening to be stopped by the said second reference edges.

7. A method as in claim 3, wherein the step of guidably delivering a second component, further comprises:

disposing in a second magazine, a plurality of second tubes in an array disposed downgrade from the leading edge of, and substantially perpendicular to the second plate;

holding in each such second tube a single column of second components having mating faces turned downward such that the weight of the column presses the mating face of a leading second component against the second plate;

disposing along the leading edge of the second plate, a plurality of second openings in an array corresponding to the second tubes and the assembly stations; and reciprocating the second plate relative to the first plate to thereby move each respective second opening along a path between a respective station and an associated second tube, each first opening passing under a second tube such that a leading second component falls into and is captured by said second opening and is moved by the second plate over a respective first component at said respective assembly station.

8. A method as in claim 1, wherein the step of supporting the first plate further comprises:

supporting a first plate which is sufficiently thin that the first component protrudes above the first plate to fully support the second component on the first component to assure accurate registration of first to second components.

9. A method as in claim 1, wherein the base has a slot extending from the leading edge into at least the portion exposed by the openings in the first and second plates at the assembly station, further comprising:

transferring at least one assembly of first and second components from the assembly station utilizing a tool having at least one clamping portion containing first and second resilient members, attached to and separated by a biasing portion located between first ends of the resilient members for clamping an assembly therebetween and second free ends for opening the clamping ends, said biasing portion holding the clamping ends in symmetrical, normally closed condition sufficient to securely grasp therebetween the assembly of first and second components; and inserting the clamping tool in an open condition into the assembly station, a first such clamping end being inserted into the slot below an assembly and a second clamping end being inserted into the second opening above the assembly, whereupon the clamping ends are closed and the clamping portion and an assembly are moved from the openings for transferring from said station the assembly of first and second components.

10. Apparatus for assembling at least one first component having an external surface opposite a mating face to at least one second component having a mating face complementary with and joinable to the mating face of the first component, comprising:

at least one assembly station formed on an upwardly extending, leading edge portion of a base, said base being inclined therefrom in a given direction sufficiently that a first component, supported with its mating face upturned and its external surface in contact with the base, and a second component, supported with its mating face in contact with the upturned mating face of the first component, will readily slide relative to each other and the base within said assembly station by the force of gravity;

a first plate, supported on and inclined with the base, and having along a leading edge substantially parallel to the leading edge of the base, at least one first opening containing first reference means for stopping sliding of, and thereby positioning the first component on the base in said assembly station;

a second plate, disposed over and inclined with the first plate, and having along a leading edge substantialy parallel to the leading edges of the base and the first plate, at least one second opening containing second reference means for stopping sliding of, and thereby positioning the second component on the first component with a desired registration of respective mating faces in said assembly station;

means for guidably delivering into at least the first opening in the first plate, a first component with its external surface in contact with the inclined base such that said first component slides to and is stopped by the first reference means and becomes thereby positioned within said assembly station; and means for guidably delivering into at least the second opening in the second plate, a second component with its mating face in contact with the mating face of the first component such that said second component slides to and is stopped by the second reference means and becomes thereby positioned upon the first component to form an assembly ready for bonding.

11. Apparatus as in claim 10, wherein the assembly station is one of a plurality of such stations disposed along the upwardly extending leading edges of the base and first and second plates in an array suitable for access to all stations substantially simultaneously for the assembly of components.

12. Apparatus as in clam 11 wherein the means for guidably delivering a first component, further comprise:
   a first magazine having a plurality of first tubes in an array disposed downgrade from the leading edge of, and substantially perpendicular to the first plate, each such first tube being adapted to hold therein a single column of first components having external surfaces facing downward such that the weight of the column presses the external surface of a leading first component against the first plate;
   said first plate having along its leading edge, a plurality of first openings in an array corresponding to the first tubes and the assembly stations; and
   means for reciprocating the first plate relative to the base to move each respective first opening along a path between a respective station and an associated first tube, each first opening passing under a first tube such that a leading first component falls into and is captured by said first opening and is moved by the first plate to said respective assembly station.

13. Apparatus as in claim 12, wherein said second plate has along its leading edge, a plurality of second openings in an array corresponding to the stations and wherein the means for guidably delivering a second component further comprises:
   a third magazine having a plurality of channels, each inclined downgrade toward and in communication with a second opening at one of the assembly stations and each channel adapted to hold, by supporting end-to-end on respective mating faces, a single file of second components for slidably delivering successive ones into a second opening such that a mating face of a respective second component slidably contacts and registers with the mating face of a respective first component; and
   an escapement mechanism associated with the third magazine for controlling downgrade, sliding advancement of and for successively releasing from each file a leading second component after a first component is guidably delivered into and positioned in a respective first opening.

14. Apparatus as in claim 13 wherein the third magazine is movable to and from the assembly stations, thereby permitting the assembly stations to be accessible and the assemblies to be removed substantially simultaneously in an array by an associated clamping and transfer means.

15. Apparatus as in claim 14, wherein the second component has a peripheral seat located within the edges of a top side, said seat substantially defining the second mating face, and the first component serves as a covering for the seat, said first component having the first mating face defined by edges of the first component and being smaller than the top side of the second component, at least when measured in a transverse direction common to the first component and the top side of the second component, both first and second components having at least two, substantially straight edges useful for reference purposes and wherein the openings further comprise:
   the first opening having first reference edges located downgrade on the inclined base portion within said opening, such edges corresponding with and being disposed substantially parallel to the reference edges of the first component as such component is guidably delivered into and slides on the inclined base within the opening to be stopped by said first reference edges;
   the second opening having second reference edges lying above the first plate and offset downgrade from the first reference edges of the first opening sufficient to accommodate a second component in an inverted condition upon and in registration with a first component in the first opening, such second reference edges corresponding with and being disposed substantially parallel to the reference edges of the second component as such component is guidably delivered into and slides upon the first component inclined with the base portion within the second opening to be stopped by the said second reference edges.

16. Apparatus as in claim 12 wherein the means for guidably delivering a second component, further comprise:
   a second magazine having a plurality of second tubes in an array disposed downgrade from the leading edge of, and substantially perpendicular to the second plate, each such second tube being adapted to hold therein a single column of second components having mating faces turned downward such that the weight of the column presses the mating face of a leading second component against the second plate;
   said second plate having along its leading edge, a plurality of second openings in an array corresponding to the second tubes and the assembly stations; and
   means for reciprocating the second plate relative to the first plate to move each respective second opening along a path between a respective station and an associated second tube, each first opening passing under a second tube such that a leading second component falls into and is captured by said second opening and is moved by the second plate over a respective first component at said respective assembly station.

17. Apparatus as in claim 10 wherein the first plate is sufficiently thin that the first component protrudes above the first plate to fully support the second component to assure accurate registration of first to second components.

18. Apparatus as in claim 10, wherein the base has a slot extending from the leading edge into at least the portion exposed by the openings in the first and second plates at the assembly station, further comprising:
   means for transferring at least one assembly of first and second components from the assembly station, said means including at least one clamping portion having first and second resilient members attached to and separated by a biasing portion located between ends of the resilient members for clamping an assembly therebetween and opposite, free ends for opening the clamping ends, said biasing portion holding the clamping ends in a symmetrical, normally closed condition sufficient to securely grasp therebetween the assembly of first and second components; and said transfer means being movable such that the clamping ends are insertable in an open condition into the assembly station, a first such clamping end being inserted into the slot below an assembly and a second clamping end being inserted into the second opening above the assembly, whereupon the clamping ends may be closed and the clamping portion and an assembly may be moved from the openings for transferring from said station the assembly of first and second components.

* * * * *